(12) United States Patent
Jan et al.

(10) Patent No.: US 11,142,351 B2
(45) Date of Patent: Oct. 12, 2021

(54) EARTH SATELLITE ATTITUDE DATA FUSION SYSTEM AND METHOD THEREOF

(71) Applicant: National Applied Research Laboratories, Taipei (TW)

(72) Inventors: Ying-Wen Jan, Hsin-Chu (TW); Ming-Yu Yeh, Hsin-Chu (TW); Wei-Ting Wei, Hsin-Chu (TW); Yeong-Wei Wu, Hsin-Chu (TW)

(73) Assignee: NATIONAL APPLIED RESEARCH LABORATORIES, Taipei (TW)

( * ) Notice: Subject to any disclaimer, the term of this patent is extended or adjusted under 35 U.S.C. 154(b) by 243 days.

(21) Appl. No.: 16/457,188

(22) Filed: Jun. 28, 2019

(65) Prior Publication Data
US 2020/0346789 A1    Nov. 5, 2020

(30) Foreign Application Priority Data
Apr. 30, 2019    (TW) ................... 108115071

(51) Int. Cl.
*B64G 1/66* (2006.01)
*H03H 17/02* (2006.01)
*G01C 21/02* (2006.01)
*G01P 15/18* (2013.01)

(52) U.S. Cl.
CPC ............ *B64G 1/66* (2013.01); *G01C 21/025* (2013.01); *G01P 15/18* (2013.01); *H03H 17/0202* (2013.01); *H03H 2017/0205* (2013.01)

(58) Field of Classification Search
CPC ......... B64G 1/66; G01C 21/025; G01P 15/18; H03H 17/0202

USPC ......................................................... 702/150
See application file for complete search history.

(56) References Cited

U.S. PATENT DOCUMENTS

| | | | |
|---|---|---|---|
| 6,454,217 B1 * | 9/2002 | Rodden | B64G 1/244 244/164 |
| 6,577,929 B2 * | 6/2003 | Johnson | B64G 1/36 244/165 |
| 7,124,001 B2 | 10/2006 | Li et al. | |
| 2004/0098178 A1 * | 5/2004 | Brady | G01C 21/025 701/4 |

(Continued)

OTHER PUBLICATIONS

Romans et al., "Optimal combination of quaternions from multiple star cameras", May 2003, 4 pages.

(Continued)

*Primary Examiner* — Aditya S Bhat
(74) *Attorney, Agent, or Firm* — Muncy, Geissler, Olds & Lowe, P.C.

(57) ABSTRACT

Provided are an earth satellite attitude data fusion system and method, applicable to an earth satellite space environment to estimate attitude data of a satellite. When the earth satellite attitude data fusion system of the present invention is used to perform the earth satellite attitude data fusion method, the first step is to perform a body rates/quaternion attitude data processing operation. Then, the next step is to perform an attitude/rates data fusion processing operation, wherein an attitude data fusion algorithm module receives a first IAE result data from a first EKF, and a second IAE result data from a second EKF, and performs an attitude/rates data fusion algorithm in a subsystem level to evaluate an attitude estimation IAE performance based on the first IAE result data, and the second IAE result data.

3 Claims, 9 Drawing Sheets

(56) References Cited

U.S. PATENT DOCUMENTS

2005/0010337 A1* 1/2005 Li ............................ B64G 1/36
                                                              701/13

OTHER PUBLICATIONS

Jorgensen et al., "On-The Fly Merging of Atittude Solutions", 5$^{th}$ International Symposium of the IAA, 2008, 9 pages.

* cited by examiner

| IAE Attitude Errors (1 sigma) Star Sensor Time Delay (τ, sec.) | X (arcsec) | Y (arcsec) | Z (arcsec) |
|---|---|---|---|
| 0 | 7.54 | 19.60 | 7.14 |
| 0.25 | 7.59 | 21.60 | 7.39 | prior art

| IAE Attitude Errors (1 sigma) Star Sensor Time Delay (τ, sec.) | X (arcsec) | Y (arcsec) | Z (arcsec) |
|---|---|---|---|
| 0 | 5.34 | 7.09 | 7.11 |
| 0.25 | 5.44 | 7.47 | 7.20 | present invention

EARTH SATELLITE ATTITUDE DATA FUSION SYSTEM AND METHOD THEREOF

CROSS-REFERENCE TO RELATED APPLICATION

This application claims the priority of Taiwanese patent application No. 108115071, filed on Apr. 30, 2019, which is incorporated herewith by reference.

BACKGROUND OF THE INVENTION

1. Field of the Invention

The technical field generally relates to a satellite attitude data system and method, and in particular, to an earth satellite attitude data fusion system and method, applicable to an earth satellite space environment to estimate attitude data of a satellite, by using a first EKF (Extended Kalman Filter) and a second EKF of a GS IAE (Gyro-Stellar Inertial Attitude Estimate), a sensor of a first star tracker, a sensor of a second star tracker, a 3-axis gyro, and an attitude data fusion algorithm module to perform an attitude/rates data fusion algorithm in a subsystem level to evaluate an attitude estimation performance.

2. The Prior Arts

As for the traditional satellite attitude determination system, for example, U.S. Patent publication No. 2004/0098178 A1 discloses an integrated inertial stellar attitude sensor using a star camera system and a gyroscope system to estimate the satellite attitude, wherein the star camera system is the IAE (Inertial Attitude Estimate) system.

For the GS (Gyro-Stellar) IAE operation, the gyro is for providing the satellite angular rate to estimate the satellite attitude, and the IAE (star tracker) is for providing the value to correct the satellite attitude estimated by the gyro.

In the prior art, a procedure for optimally combining attitude data measured simultaneously from differently aligned star cameras, given (Gaussian) noise models was proposed. In this approach, the orientations from each star camera to the common reference frame are assumed to be known.

In the prior art, a method is proposed to various satellite programs for merging the multiple attitude solutions.

U.S. Pat. No. 7,124,001 disclosed "Relative Attitude Estimator For Multi-Payload Attitude Determination", wherein inventors disclosed a method and apparatus for estimating the relative attitude between the slave payload attitude and the master payload attitude using a relative attitude model parameter estimator. By processing the slave payload attitude and the master payload attitude, the relative attitude model parameter estimator estimates the relative attitude between a "slave channel" attitude determination sensor and a "master channel" attitude determination sensor. The relative attitude estimator output allows "slave channel" measurements to be corrected to be consistent with the "master channel" and consequently used to improve the determination of the attitude of the slave payload.

"Gyro-Stellar (GS) Inertial Attitude Estimate (IAE)" or "Stellar Inertial Attitude Determination (SIAD)" is a subsystem that combines the attitude provided by a body-mounted 3-axes gyro, and the attitude provided by a body-mounted star sensor (or multiple body-mounted star sensors) to produce a best estimate of spacecraft body attitude through the use of an Extended Kalman Filter. This art has been applied to many existing satellite Attitude and Orbit Control System (AOCS) such as NASA's GOES programs and others.

Recent advances in the construction of MEMS devices have made it possible to manufacture small and light weight inertial sensors. These advances have widened the range of possible applications in many commercial as well as military areas. However, because of its low accuracy, the devices have limited their applications to tasks requiring high-precision.

Therefore, the issues need to be addressed include how to obtain an earth satellite attitude data fusion system and method by using less quantity of star trackers, for example, two star trackers wherein each star tracker has a sensor, less quantity of gyros, for example, only one 3-axis gyro, and a certain quantity of Extended Kalman Filters, for example, two Extended Kalman Filters to determine a better estimation of the spacecraft attitude data, solve the low accuracy problem of small and light weight inertial sensors, for example, star trackers, of MEMS devices, and obtain high-precision satellite attitude data of the earth satellite attitude data fusion system and method in evaluating an attitude estimation IAE performance.

SUMMARY OF THE INVENTION

A main object of the present invention is to provide an earth satellite attitude data fusion system and method, applicable to an earth satellite space environment to estimate attitude data of a satellite. When the earth satellite attitude data fusion system of the present invention is used to perform the earth satellite attitude data fusion method, the first step is to perform a body rates quaternion attitude data processing operation, wherein a first EKF (Extended Kalman Filter) receives body rates data from a 3-axis gyro, and first quaternion attitude data from a sensor of a first star tracker, and performs an first algorithm based on the body rates data and the first quaternion attitude data to obtain first IAE (Inertial Attitude Estimate) result data and output it, and wherein a second EKF(Extended Kalman Filter) receives the body rates data from the 3-axis gyro, and second quaternion attitude data from a sensor of a second star tracker, and performs an second algorithm based on the body rates data and the second quaternion attitude data to obtain second IAE (Inertial Attitude Estimate) result data and output it. Then, the next step is to perform an attitude/rates data fusion processing operation, wherein an attitude data fusion algorithm module receives the first IAE result data from the first EKF, and the second IAE result data from the second EKF, and performs an attitude/rates data fusion algorithm in a subsystem level to evaluate an attitude estimation IAE performance.

Another object of the present invention is to provide an earth satellite attitude data fusion system and method, applicable to the earth satellite space environment to estimate attitude data of the satellite. The first EKF of a GS IAE (Gyro-Stellar (GS) Inertial Attitude Estimate (IAE)) receives body rates data from the 3-axis gyro and first sensor attitude data from the sensor of the first star tracker, and performs an first algorithm based on the body rates data and the first sensor attitude data to obtain the first IAE (Inertial Attitude Estimate) result data and output it. The second EKF (Extended Kalman Filter) of the GS IAE (Gyro-Stellar (GS) Inertial Attitude Estimate (IAE)) receives the body rates data from the 3-axis gyro and second sensor attitude data from the sensor of the second star tracker, and performs an second algorithm based on the body rates data and the second sensor attitude data to obtain second IAE (Inertial Attitude Estimate) result data and output it. An attitude/rates data fusion processing operation is performed by using the first IAE result data and the second IAE result data and performing the attitude/rates data fusion algorithm.

Yet another object of the present invention is to provide an earth satellite attitude data fusion system and method, applicable to the earth satellite space environment to estimate attitude data of the satellite by using less quantity of star trackers, for example, two star trackers wherein each star tracker has a sensor, less quantity of gyros, for example, only one 3-axis gyro, and a certain quantity of Extended Kalman Filters, for example, two Extended Kalman Filters to determine a better estimation of the spacecraft attitude data.

Yet another object of the present invention is to provide an earth satellite attitude data fusion system and method, applicable to the earth satellite environment to estimate attitude data of the satellite to solve the low accuracy problem of small and light weight inertial sensors, for example, star trackers, of MEMS devices, and to obtain high-precision satellite attitude data of the earth satellite attitude data fusion system and method in evaluating an attitude estimation IAE performance.

To achieve the aforementioned objects, the present invention provides an earth satellite attitude data fusion system, comprising at least: a first EKF and a second EKF of a GS IAE, a sensor of a first star tracker, a sensor of a second star tracker, a 3-axis gyro, and an attitude data fusion algorithm module.

First EKF: the first EKF of a GS IAE receives gyro attitude data from a 3-axis gyro, and first sensor attitude data from a sensor of a first star tracker, and performs an first algorithm based on the gyro attitude data and the first sensor attitude data to obtain first IAE (Inertial Attitude Estimate) result data and output it to an attitude data fusion algorithm module.

Second EKF: the second EKF of the GS IAE receives the gyro attitude data from the 3-axis gyro, and second sensor attitude data from a sensor of a second star tracker, and performs an second algorithm based on the gyro attitude data and the second sensor attitude data to obtain second IAE (Inertial Attitude Estimate) result data and output it to the attitude data fusion algorithm module.

Attitude data fusion algorithm module: the attitude data fusion algorithm module receives the first IAE result data and the second IAE result data, and performs an attitude/rates data fusion algorithm in a subsystem level to evaluate an attitude estimation IAE performance.

When the earth satellite attitude data fusion system of the present invention is used to perform the earth satellite attitude data fusion method, the first step is to perform a body rates/quaternion attitude data processing operation, wherein a first EKF (Extended Kalman Filter) receives body rates data from a 3-axis gyro, and first quaternion attitude data from a sensor of a first star tracker, and performs an first algorithm based on the body rates data and the first quaternion attitude data to obtain first IAE (Inertial Attitude Estimate) result data and output it to an attitude data fusion algorithm module, and the body rates data is gyro attitude data of the 3-axis gyro and the first quaternion attitude data is first sensor attitude data of the sensor of the first star tracker, and wherein a second EKF (Extended Kalman Filter) receives the body rates data from the 3-axis gyro, and the second quaternion attitude data from the sensor of the second star tracker, and performs an second algorithm based on the body rates data and the second quaternion attitude data to obtain second IAE (Inertial Attitude Estimate) result data and output it to the attitude data fusion algorithm module, and the second quaternion attitude data is the second sensor attitude data of the sensor of the second star tracker.

Then, the next step is to perform an attitude/rates data fusion processing operation, wherein the attitude data fusion algorithm module receives the first IAE result data and the second IAE result data, and performs an attitude/rates data fusion algorithm in a subsystem level to evaluate an attitude estimation IAE performance.

Thus, the earth satellite attitude data fusion system and method of the present invention performs an attitude/rates data fusion algorithm in a subsystem level by using less quantity of star trackers, for example, two star trackers wherein each star tracker has a sensor, less quantity of gyros, for example, only one 3-axis gyro, and a certain quantity of Extended Kalman Filters, for example, two Extended Kalman Filters to determine a better estimation of the spacecraft attitude data and evaluate a better attitude estimation IAE performance, wherein by using only the 3 axis gyro, the sensor of the first star tracker and the sensor of the second star tracker, and the first EKF and the second EKF of the GS IAE as those two EKFs, thus, a small and light weight spacecraft can be achieved, the low accuracy problem of small and light weight inertial sensors, for example, star trackers, of MEMS devices is solved, and the earth satellite attitude data fusion system and method of the present invention is suitable for use in the application of obtaining the attitude estimation IAE performance for the high-precision satellite attitude data.

The foregoing will become better understood from a careful reading of a detailed description provided herein below with appropriate reference to the accompanying drawings.

BRIEF DESCRIPTION OF THE DRAWINGS

The embodiments can be understood in more detail by reading the subsequent detailed description in conjunction with the examples and references made to the accompanying drawings, wherein.

DETAILED DESCRIPTION OF THE DISCLOSED EMBODIMENTS

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
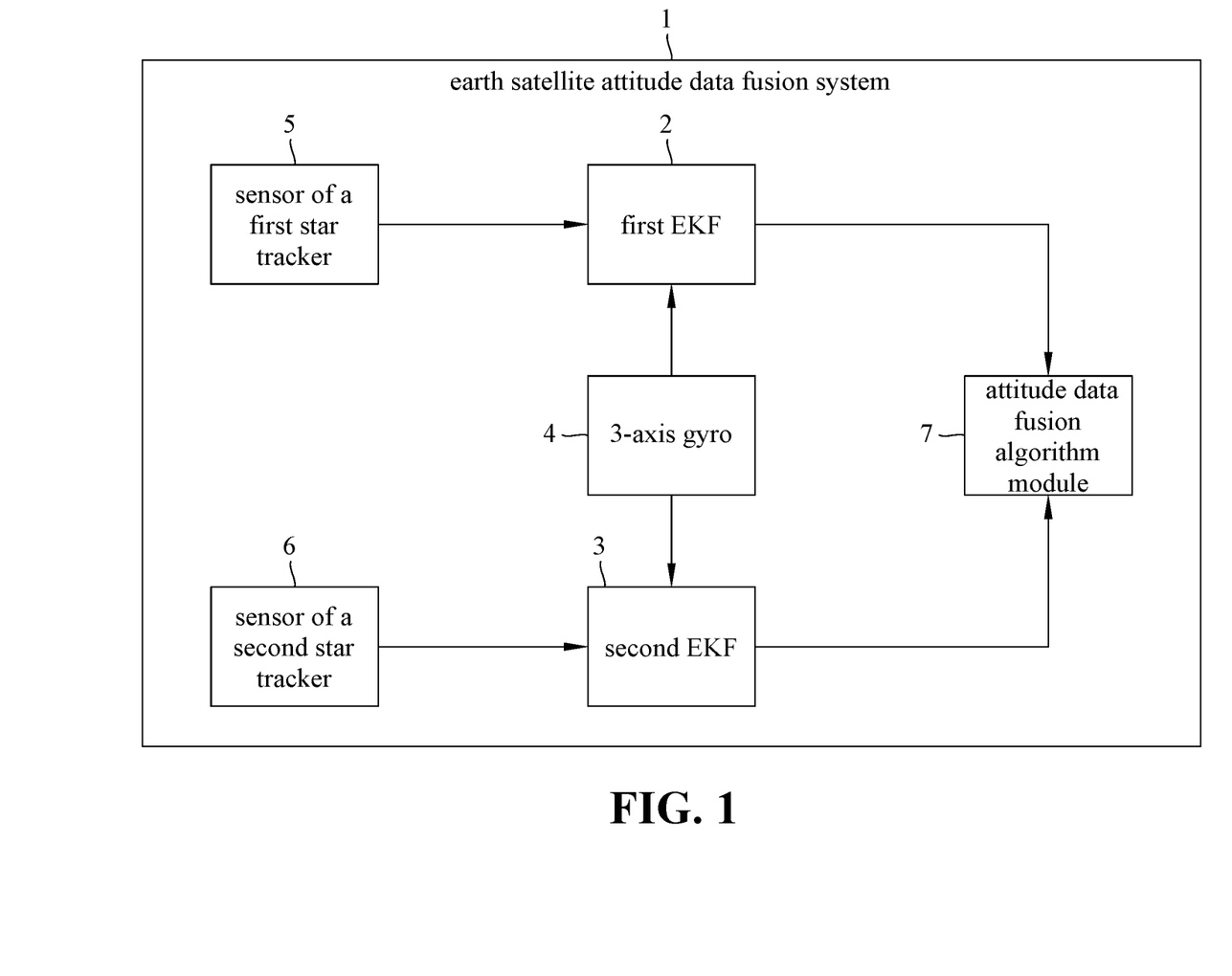
FIG. 1 is a schematic view to illustrate the structure of the earth satellite attitude data fusion system according to the present invention.

FIG. 1 is a schematic view to illustrate the structure of the earth satellite attitude data fusion system according to the present invention. As shown in FIG. 1, an earth satellite attitude data fusion system 1 comprises at least: a first EKF 2 and a second EKF 3 of a GS IAE, a 3 axis gyro 4, a sensor of a first star tracker 5, a sensor of a second star tracker 6, and an attitude data fusion algorithm module 7, wherein the 3-axis gyro 4 and the sensor of the first star tracker 5 are connected to the first EKF 2, respectively, the 3-axis gyro 4 and the sensor of the second star tracker 6 are connected to the second EKF 3, respectively, the first EKF 2 and the second EKF 3 are connected to the attitude data fusion algorithm module 7, respectively.

The first EKF 2: the first EKF 2 of a GS IAE receives gyro attitude data from the 3 axis gyro 4, and first sensor attitude data from the sensor of the first star tracker, and performs an first algorithm based on the gyro attitude data and the first sensor attitude data to obtain first IAE (Inertial Attitude Estimate) result data and output it to an attitude data fusion algorithm module 7.

The second EKF 3: the second EKF 3 of the GS IAE receives the gyro attitude data from the 3 axis gyro 4, and second sensor attitude data from the sensor of the second star tracker, and performs an second algorithm based on the gyro attitude data and the second sensor attitude data to obtain second IAE (Inertial Attitude Estimate) result data and output it to the attitude data fusion algorithm module 7.

The attitude data fusion algorithm module 7: the attitude data fusion algorithm module 7 receives the first IAE result data and the second IAE result data, and performs an attitude/rates data fusion algorithm in a subsystem level to evaluate an attitude estimation IAE performance.

Figure 2:
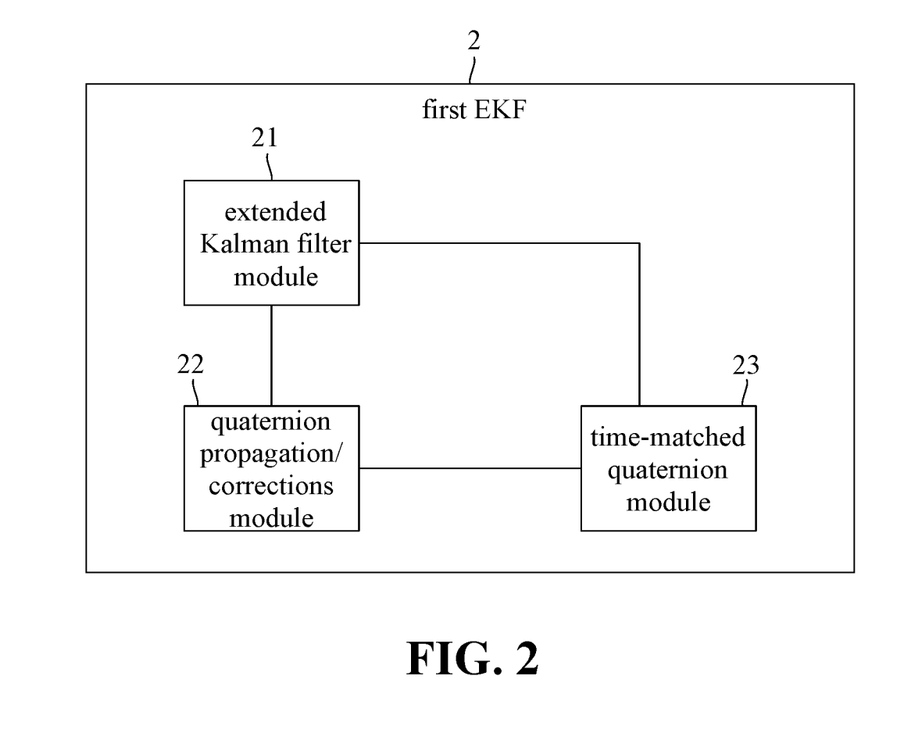
FIG. 2 is a schematic view to illustrate the structure of the first EKF of the earth satellite attitude data fusion system according to the present invention.

FIG. 2 is a schematic view to illustrate the structure of the first EKF of the earth satellite attitude data fusion system according to the present invention. As shown in the figure, the first EKF 2, comprising: an extended Kalman filter module 21, a quaternion propagation/corrections module 22, and a time-matched quaternion module 23, wherein the extended Kalman filter module 21, the quaternion propagation/corrections module 22, and the time-matched quaternion module 23 collaboratively proceed a quaternion spacecraft attitude data correction process in a feedback working mode according to gyro attitude data from the 3-axis gyro 4, and the first sensor attitude data from the sensor of the first star tracker 5.

The extended Kalman filter module 21 receives the first sensor attitude data form the sensor of the first star tracker 5, and previously last first sensor attitude data of the sensor of the first star tracker 5 from the time-matched quaternion module 23. The extended Kalman filter module 21 obtains bias correction data and attitude correction data, and provides them to the quaternion propagation/corrections module 22 according to the first sensor attitude data and the previously last first sensor attitude data.

The quaternion propagation/corrections module 22 receives the bias correction data and the attitude correction data form the extended Kalman filter module 21. According the gyro attitude data, the bias correction data and the attitude correction data, the quaternion propagation/corrections module 22 corrects quaternion attitude data, obtains the first IAE result data and provides that to the attitude data fusion algorithm module 7. The quaternion propagation/corrections module 22 provides corrected quaternion attitude data to the time-matched quaternion module 23.

Figure 3:
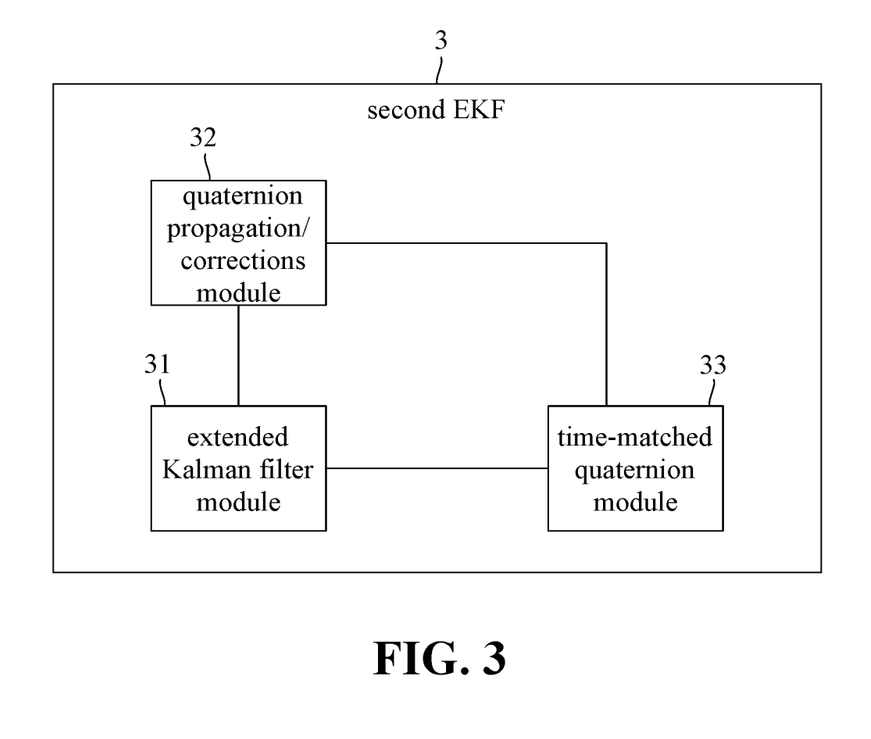
FIG. 3 is a schematic view to illustrate the structure of the second EKF of the earth satellite attitude data fusion system according to the present invention.

FIG. 3 is a schematic view to illustrate the structure of the second EKF of the earth satellite attitude data fusion system according to the present invention. As shown in the figure, the second EKF 3, comprising: an extended Kalman filter module 31, a quaternion propagation/corrections module 32, and a time-matched quaternion module 33, wherein the extended Kalman filter module 31, the quaternion propagation/corrections module 32, and the time-matched quaternion module 33 collaboratively proceed a quaternion spacecraft attitude data correction process in a feedback working mode according to gyro attitude data from the 3-axis gyro 4, and the second sensor attitude data from the sensor of the second star tracker 6.

The extended Kalman filter module 31 receives the second sensor attitude data form the sensor of the second star tracker 6, and previously last second sensor attitude data of the sensor of the second star tracker 6 from the time-matched quaternion module 33. The extended Kalman filter module 31 obtains bias correction data and attitude correction data, and provides them to the quaternion propagation/corrections module 32 according to the second sensor attitude data and the previously last second sensor attitude data.

The quaternion propagation/corrections module 32 receives the correction data and the attitude correction data form the extended Kalman filter module 31. According the gyro attitude data, the correction data and the attitude correction data from the extended Kalman filter module 31, the quaternion propagation/corrections module 32 corrects quaternion attitude data, obtains the second IAE result data and provides that to the attitude data fusion algorithm module 7. The quaternion propagation/corrections module 32 provides corrected quaternion attitude data to the time-matched quaternion module 33.

Figure 4:
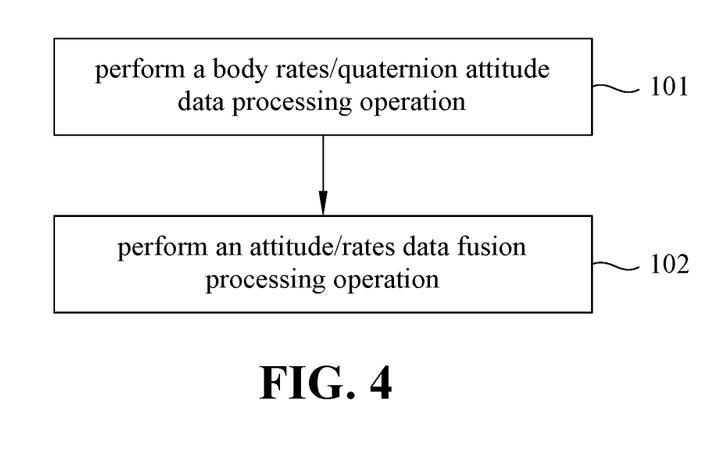
FIG. 4 is a flowchart to illustrate the earth satellite attitude data fusion method performed by the earth satellite attitude data fusion system according to the present invention.

FIG. 4 is a flowchart to illustrate the earth satellite attitude data fusion method performed by the earth satellite attitude data fusion system according to the present invention.

As shown in FIG. 4, step 101 is to perform a body rates/quaternion attitude data processing operation, wherein the first EKF 2 receives the body rates data from the 3-axis gyro 4, and the first quaternion attitude data from the sensor of the first star tracker 5, and performs the first algorithm based on the body rates data and the first quaternion attitude data to obtain the first IAE result data and output it to the attitude data fusion algorithm module 7, and the body rates data is the gyro attitude data of the 3-axis gyro 4 and the first quaternion attitude data is the first sensor attitude data of the sensor of the first star tracker 5, and wherein the second EKF 3 receives the body rates data from the 3-axis gyro 4, and the second quaternion attitude data from the sensor of the second star tracker 6, and performs the second algorithm based on the body rates data and the second quaternion attitude data to obtain second IAE result data and output it to the attitude data fusion algorithm module 7, and the second quaternion attitude data is the second sensor attitude data of the sensor of the second star tracker 6. Then, proceed to step 102.

During step 101, the extended Kalman filter module 21, the quaternion propagation/corrections module 22, and the time-matched quaternion module 23 collaboratively proceed a quaternion spacecraft attitude data correction process in a feedback working mode according to gyro attitude data from the 3-axis gyro 4, and the first sensor attitude data from the sensor of the first star tracker 5.

The extended Kalman filter module 21 receives the first sensor attitude data form the sensor of the first star tracker 5, and previously last first sensor attitude data of the sensor of the first star tracker 5 from the time-matched quaternion module 23. The extended Kalman filter module 21 obtains bias correction data and attitude correction data, and provides them to the quaternion propagation/corrections module 22 according to the first sensor attitude data and the previously last first sensor attitude data.

The quaternion propagation/corrections module 22 receives the correction data and the attitude correction data form the extended Kalman filter module 21. According the gyro attitude data, the correction data and the attitude correction data, the quaternion propagation/corrections module 22 corrects quaternion attitude data, obtains the first IAE result data and provides that to the attitude data fusion algorithm module 7. The quaternion propagation/corrections module 22 provides corrected quaternion attitude data to the time-matched quaternion module 23.

Also, during step 101, the extended Kalman filter module 31, the quaternion propagation/corrections module 32, and the time-matched quaternion module 33 collaboratively proceed a quaternion spacecraft attitude data correction process in a feedback working mode according to gyro attitude data from the 3-axis gyro 4, and the second sensor attitude data from the sensor of the second star tracker 6.

The extended Kalman filter module 31 receives the second sensor attitude data form the sensor of the second star tracker 6, and previously last second sensor attitude data of the sensor of the second star tracker 6 from the time-matched quaternion module 33. The extended Kalman filter module 31 obtains bias correction data and attitude correction data, and provides them to the quaternion propagation/corrections module 32 according to the second sensor attitude data and the previously last second sensor attitude data.

The quaternion propagation/corrections module 32 receives the correction data and the attitude correction data form the extended Kalman filter module 31. According the gyro attitude data, the correction data and the attitude correction data from the extended Kalman filter module 31, the quaternion propagation/corrections module 32 corrects quaternion attitude data, obtains the second IAE result data and provides that to the attitude data fusion algorithm module 7. The quaternion propagation/corrections module 32 provides corrected quaternion attitude data to the time-matched quaternion module 33.

Step 102 is to perform an attitude/rates data fusion processing operation, wherein the attitude data fusion algorithm module 7 receives the first IAE result data and the second IAE result data, and performs the attitude/rates data fusion algorithm in a subsystem level to evaluate an attitude estimation IAE performance.

Figure 5:
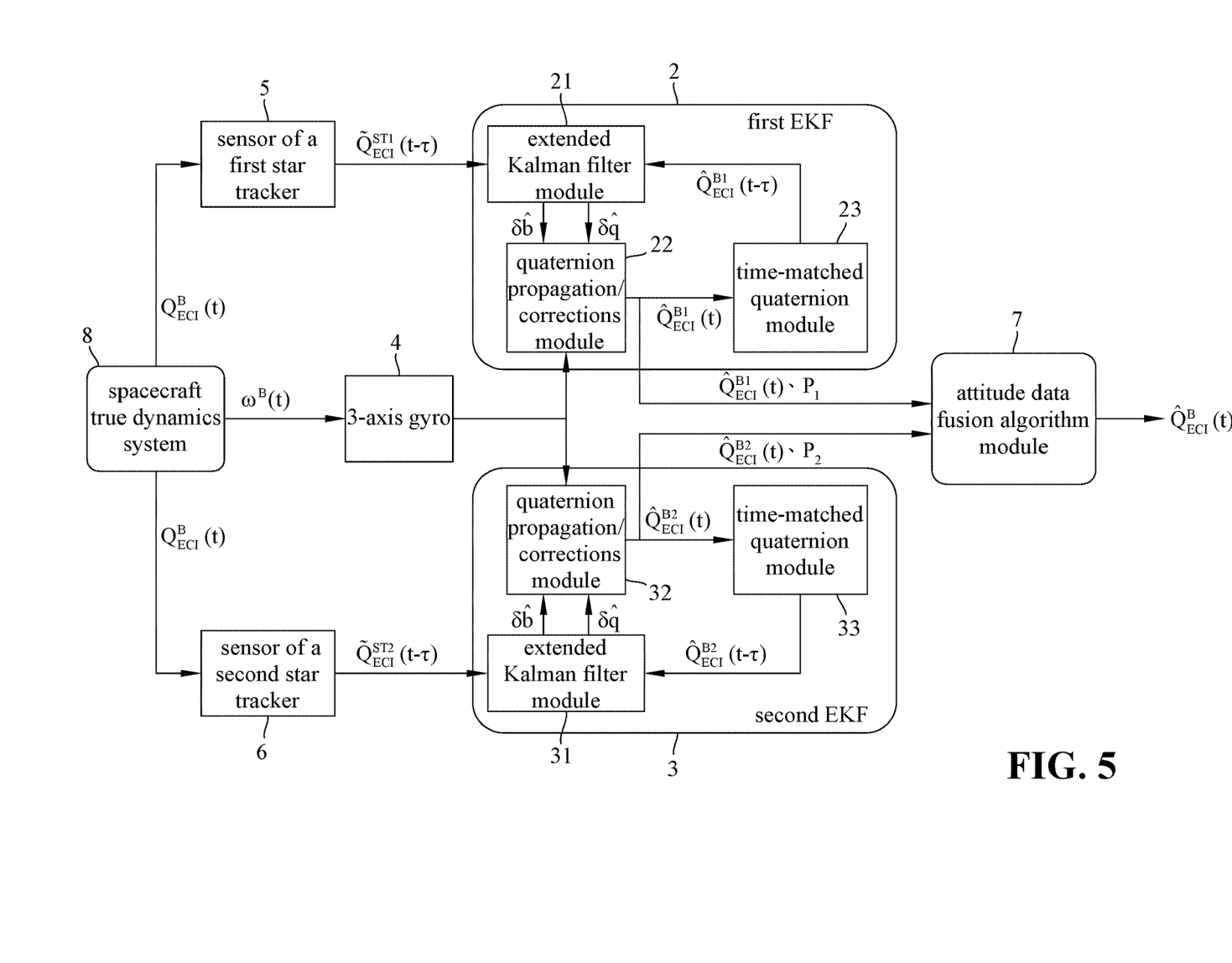
FIG. 5 is a schematic view to illustrate the structure and operation of the earth satellite attitude data fusion system according to an embodiment of the present invention.

FIG. 5 is a schematic view to illustrate the structure and operation of the earth satellite attitude data fusion system according to an embodiment of the present invention.

As shown in FIG. 5, an earth satellite attitude data fusion system 1, comprising at least: a first EKF 2 and a second EKF 3 of a GS IAE, a 3 axis gyro 4, a sensor of a first star tracker 5, a sensor of a second star tracker 6, and an attitude data fusion algorithm module 7, wherein the axis gyro 4 and the sensor of the first star tracker 5 are connected to the first EKF 2, respectively, the axis gyro 4 and the sensor of the second star tracker 6 are connected to the second EKF 3, respectively, the first EKF 2 and the second EKF 3 are connected to the attitude data fusion algorithm module 7, respectively.

As shown in the figure, in time t, the 3-axis gyro 4 receives the spacecraft body rates $\omega^B(t)$ (the spacecraft rotation rates) from the spacecraft true dynamics system 8, wherein the spacecraft body rates $\omega^B(t)$ are body rates in the spacecraft body frame coordinates B.

The 3-axis gyro 4 receives the spacecraft body rates $\omega^B(t)$ and proceed that to output body rates $\tilde{\omega}^B(t)$, wherein the body rates $\tilde{\omega}^B(t)$ is body rates (spacecraft rotation rates) of the 3-axis gyro in the spacecraft body frame coordinates B, the body rates $\tilde{\omega}^B(t)$ is the gyro attitude data, and the 3-axis gyro 4 can output the body rates $\tilde{\omega}^B(t)$ without proceeding or with proceeding misalignment bias corrections depending on practical situations.

The sensor of the first star tracker 5 receives quaternion attitude data $Q_{ECI}^B(t)$ (time t) of the spacecraft from the spacecraft true dynamics system 8, wherein the quaternion attitude data $Q_{ECI}^B(t)$ of the spacecraftare are quaternion attitude data converting from the ECI (Earth-Centered Inertial) frame coordinates to the spacecraft body frame coordinates B. According to the quaternion attitude data $Q_{ECI}^B(t)$ of the spacecraftare, the sensor of the first star tracker 5 outputs previous quaternion attitude data $\tilde{Q}_{ECI}^{ST1}(t-\tau)$ (time $(t-\tau)$) of the sensor of the first star tracker 5 to the first EKF 2, wherein the previous quaternion attitude data $\tilde{Q}_{ECI}^{ST1}(t-\tau)$ (time $(t-\tau)$) are the quaternion attitude data converting from the ECI (Earth-Centered Inertial) frame coordinates to the sensor of the first star tracker 5, and is first sensor attitude data of the sensor of the first star tracker 5.

The first EKF 2: the first EKF 2 of a GS IAE receives body rates data $\tilde{\omega}^B(t)$ (gyro attitude data) from the 3-axis gyro 4, and quaternion attitude data $\tilde{Q}_{ECI}^{ST1}(t-\tau)$ (time $(t-\tau)$) from the sensor of the first star tracker 5, wherein the quaternion attitude data $\tilde{Q}_{ECI}^{ST1}(t-\tau)$ is the first sensor attitude data of the sensor of the first star tracker. After receiving the body rates data $\tilde{\omega}^B(t)$ (the gyro attitude data) and the quaternion attitude data $\tilde{Q}_{ECI}^{ST1}(t-\tau)$ (the first sensor attitude data), the first EKF 2 performs an first algorithm based on the gyro attitude data and the first sensor attitude data to obtain first IAE (Inertial Attitude Estimate) result data $\hat{Q}_{ECI}^{B1}(t) \cdot P_1$ (time t) and output it to an attitude data fusion algorithm module 7.

The sensor of the second star tracker 6 receives quaternion attitude data $Q_{ECI}^B(t)$ (time t) of the spacecraft from the spacecraft true dynamics system 8, wherein the quaternion attitude data $Q_{ECI}^B(t)$ of the spacecraftare are the quaternion attitude data converting from the ECI (Earth-Centered Inertial) frame coordinates to the spacecraft body frame coordinates B. According to the quaternion attitude data $Q_{ECI}^B(t)$ of the spacecraftare, the sensor of the second star tracker 6 outputs previous time $(t-\tau)$ quaternion attitude data $\tilde{Q}_{ECI}^{ST2}(t-\tau)$ of the sensor of the second star tracker 6 to the second EKF 3, wherein the previous quaternion attitude data $\tilde{Q}_{ECI}^{ST2}(t-\tau)$ (time $(t-\tau)$) is the quaternion attitude data converting from the ECI (Earth-Centered Inertial) frame coordinates to the sensor of the second star tracker 6, and is second sensor attitude data of the sensor of the second star tracker 6.

The second EKF 3: the second EKF 3 of a GS IAE receives body rates data $\tilde{\omega}^B(t)$ (gyro attitude data) from the 3-axis gyro 4, and quaternion attitude data $\tilde{Q}_{ECI}^{ST2}(t-\tau)$ (time $(t-\tau)$) from the sensor of the second star tracker 6, wherein the quaternion attitude data $\tilde{Q}_{ECI}^{ST2}(t-\tau)$ is the second sensor attitude data of the sensor of the second star tracker 6. After receiving the body rates data $\tilde{\omega}^B(t)$ (the gyro attitude data) and the quaternion attitude data $\tilde{Q}_{ECI}^{ST2}(t-\tau)$ (the second sensor attitude data), the second EKF 3 performs an second algorithm based on the gyro attitude data and the second sensor attitude data to obtain second IAE (Inertial Attitude Estimate) result data $\hat{Q}_{ECI}^{B2}(t) \cdot P_2$ (time t) and output it to an attitude data fusion algorithm module 7.

Meanwhile, the P1 and P2 are time varying parameters, and, however, an algorithm can be performed by using stability of the P1 and P2 parameters.

The attitude data fusion algorithm module 7: the attitude data fusion algorithm module 7 receives the first IAE result data $\hat{Q}_{ECI}^{B1}(t) \cdot P_1$ and the second IAE result data $\hat{Q}_{ECI}^{B2}(t) \cdot P_2$, and performs an attitude/rates data fusion algorithm in a subsystem level to evaluate an attitude estimation IAE performance and outputs quaternion attitude data $\hat{Q}_{ECI}^{B}(t)$ (time t).

Figure 6:
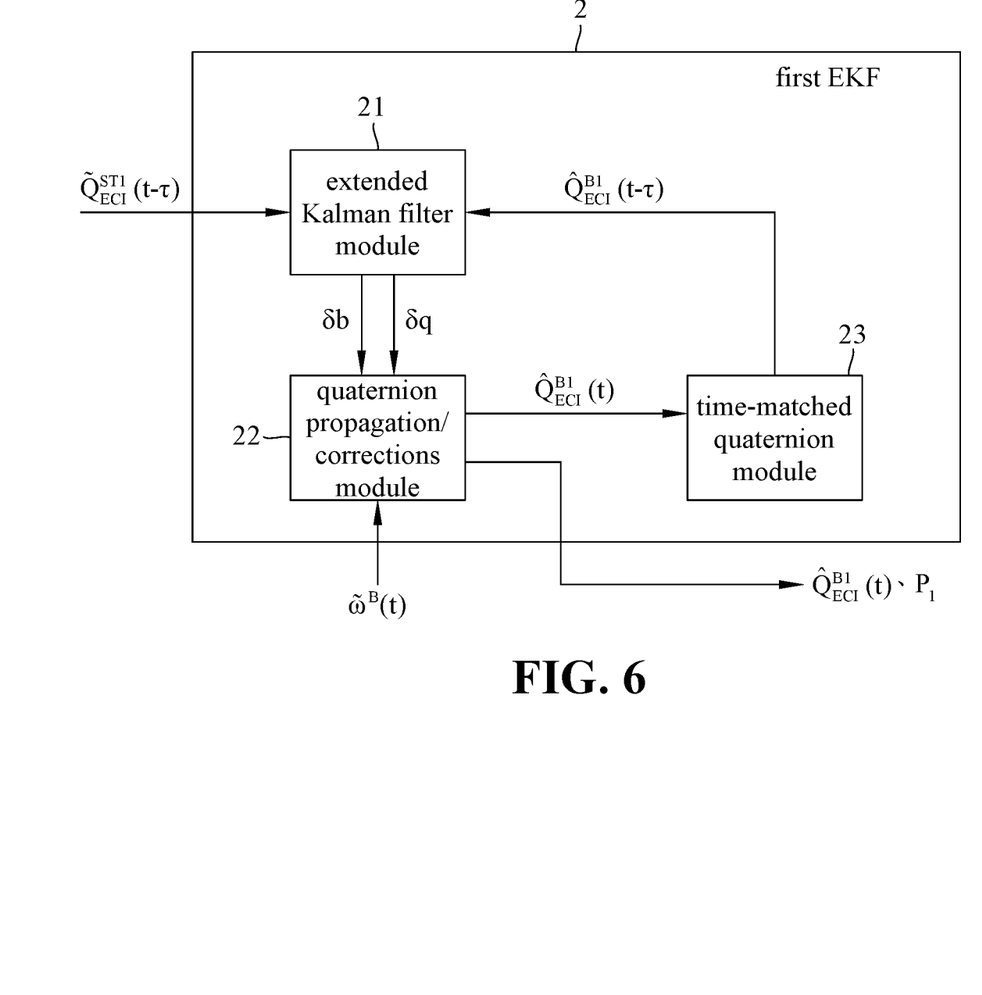
FIG. 6 is a schematic view to illustrate the structure of the first EKF of the earth satellite attitude data fusion system according to an embodiment of the present invention in FIG. 5.

FIG. 6 is a schematic view to illustrate the structure of the first EKF of the earth satellite attitude data fusion system according to an embodiment of the present invention in FIG. 5.

As shown in the figure, the first EKF 2, comprising: an extended Kalman filter module 21, a quaternion propagation/corrections module 22, and a time-matched quaternion module 23, wherein the extended Kalman filter module 21, the quaternion propagation/corrections module 22, and the time-matched quaternion module 23 collaboratively proceed a quaternion spacecraft attitude data correction process in a feedback working mode according to gyro attitude data $\tilde{\omega}^B(t)$ from the 3-axis gyro 4, and the first sensor attitude data $\tilde{Q}_{ECI}^{ST1}(t-\tau)$ (time $(t-\tau)$) from the sensor of the first star tracker 5.

The extended Kalman filter module 21 receives the first sensor attitude data $\tilde{Q}_{ECI}^{ST1}(t-\tau)$ (time $(t-\tau)$) from the sensor of the first star tracker 5, and previously last first sensor attitude data QB1/ECI(t−τ) (quaternion attitude data related to the quaternion attitude data $\tilde{Q}_{ECI}^{ST1}(t-\tau)$ (time $(t-\tau)$) of the sensor of the first star tracker 5) of the sensor of the first star tracker 5 from the time-matched quaternion module 23, wherein the previously last first sensor attitude data QB1/ECI(t−τ) is quaternion attitude data (time $(t-\tau)$) converting from the ECI (Earth-Centered Inertial) frame coordinates to the spacecraft body frame coordinates B1(the sensor of the first star tracker 5). The extended Kalman filter module 21 obtains bias correction data δb and attitude correction data δq, and provides them to the quaternion propagation/corrections module 22, according to the first sensor attitude data $\tilde{Q}_{ECI}^{ST1}(t-\tau)$ and the previously last first sensor attitude data QB1/ECI(t−τ).

The quaternion propagation/corrections module 22 receives the bias correction data δb and the attitude correction data δq from the extended Kalman filter module 21. According the gyro attitude data $\tilde{\omega}^B(t)$, the bias correction data δb and the attitude correction data δq, the quaternion propagation/corrections module 22 corrects quaternion attitude data, obtains the first IAE result data $\hat{Q}_{ECI}^{B1}(t) \cdot P_1$ and provides it to the attitude data fusion algorithm module 7. The quaternion propagation/corrections module 22 provides corrected quaternion attitude data QB1/ECI(t) to the time-matched quaternion module 23, wherein first sensor attitude data QB1/ECI(t) of the sensor of the first star tracker 5 is quaternion attitude data related to the quaternion attitude data $\tilde{Q}_{ECI}^{ST1}(t-\tau)$ of the sensor of the first star tracker 5.

Figure 7:
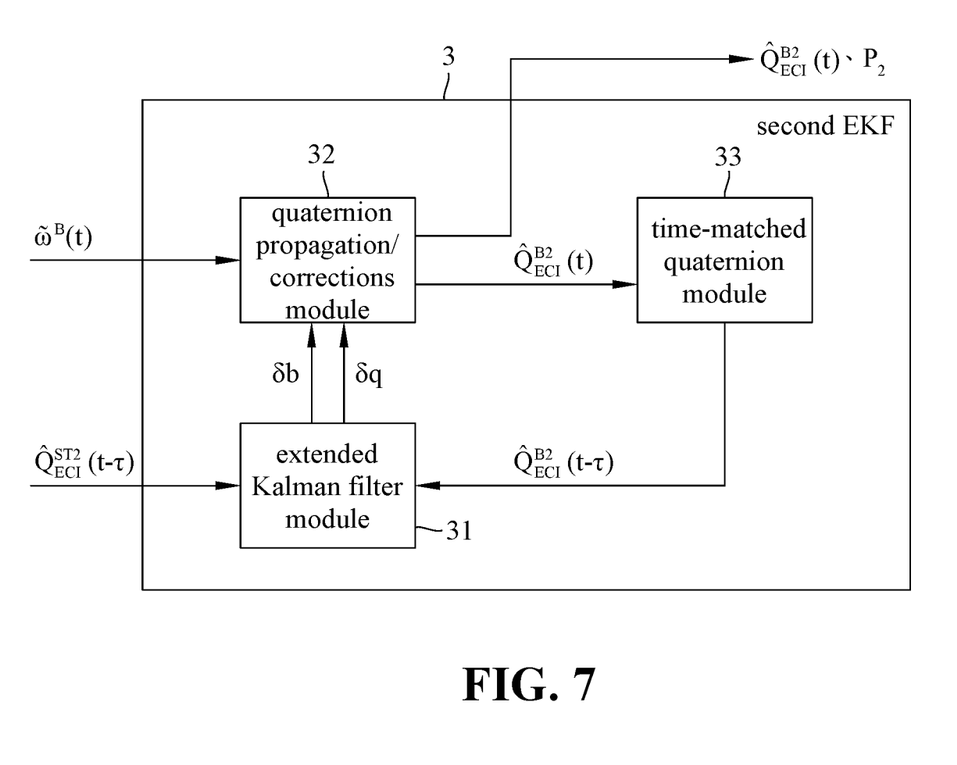
FIG. 7 is a schematic view to illustrate the structure of the second EKF of the earth satellite attitude data fusion system according to an embodiment of the present invention in FIG. 5.

FIG. 7 is a schematic view to illustrate the structure of the second EKF of the earth satellite attitude data fusion system according to an embodiment of the present invention in FIG. 5.

As shown in the figure, the second EKF 3 comprising: an extended Kalman filter module 31, a quaternion propagation/corrections module 32, and a time-matched quaternion module 33, wherein the extended Kalman filter module 31, the quaternion propagation/corrections module 32, and the time-matched quaternion module 33 collaboratively proceed a quaternion spacecraft attitude data correction process in a feedback working mode according to gyro attitude data $\tilde{\omega}^B(t)$ from the 3-axis gyro 4, and the second sensor attitude data $\tilde{Q}_{ECI}^{ST2}(t-\tau)$ (time $(t-\tau)$) from the sensor of the second star tracker 6.

The extended Kalman filter module 31 receives the second sensor attitude data $\tilde{Q}_{ECI}^{ST2}(t-\tau)$ (time $(t-\tau)$) from the sensor of the second star tracker 6, and previously last second sensor attitude data QB2/ECI(t−τ) (quaternion attitude data related to the quaternion attitude data $\tilde{Q}_{ECI}^{ST2}(t-\tau)$ (time $(t-\tau)$) of the sensor of the second star tracker 6) of the sensor of the second star tracker 6 from the time-matched quaternion module 33, wherein the previously last second sensor attitude data QB2/ECI(t−τ) is quaternion attitude data (time $(t-\tau)$) converting from the ECI (Earth-Centered Inertial) frame coordinates to the spacecraft body frame coordinates B2 (the sensor of the second star tracker 6). The extended Kalman filter module 31 obtains bias correction data δb and attitude correction data δq, and provides them to the quaternion propagation/corrections module 32, according to the second sensor attitude data $\tilde{Q}_{ECI}^{ST2}(t-\tau)$ and the previously last second sensor attitude data QB2/ECI(t−τ).

The quaternion propagation/corrections module 32 receives the bias correction data δb and the attitude correction data δq from the extended Kalman filter module 31. According the gyro attitude data $\tilde{\omega}^B(t)$, the bias correction data δb and the attitude correction data δq, the quaternion propagation/corrections module 32 corrects quaternion attitude data, obtains the second IAE result data $\hat{Q}_{ECI}^{B2}(t) \cdot P_2$ and provides it to the attitude data fusion algorithm module 7. The quaternion propagation/corrections module 32 provides corrected quaternion attitude data QB2/ECI(t) to the time-matched quaternion module 33, wherein second sensor attitude data QB2/ECI(t) of the sensor of the second star tracker 6 is quaternion attitude data related to the quaternion attitude data $\tilde{Q}_{ECI}^{ST2}(t-\tau)$ of the sensor of the second star tracker 6.

Figure 8:
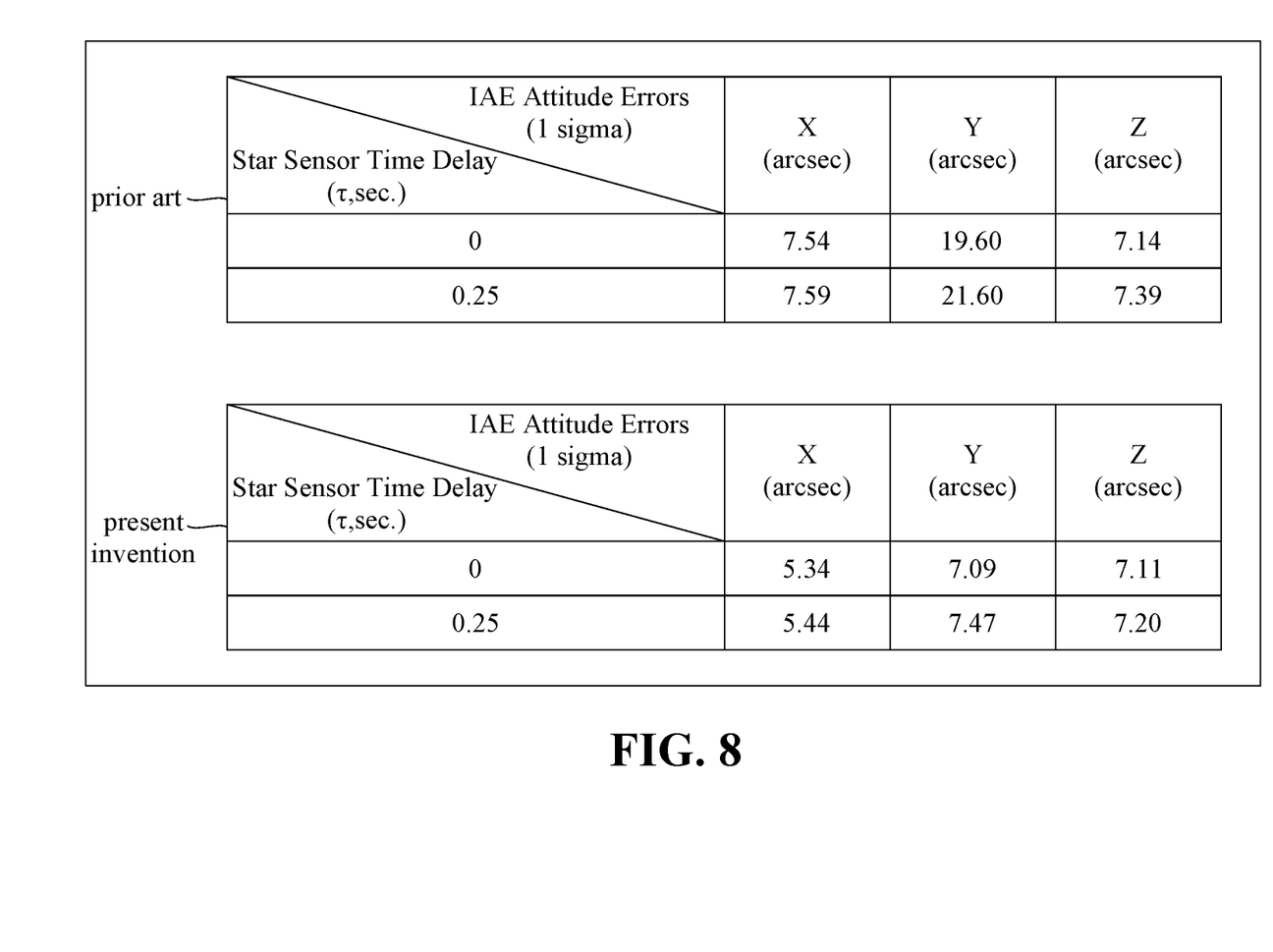
FIG. 8 is a table to illustrate the comparison of the attitude estimation IAE performance between an embodiment of the earth satellite attitude data fusion system of the present invention and the prior art.

FIG. 8 is a table to illustrate the comparison of the attitude estimation IAE performance between an embodiment of the earth satellite attitude data fusion system of the present invention and the prior art.

Hence, the one sigma attitude error can be approximated by:

$$\sigma_{\Delta\theta} = \sqrt{p_{11}} \approx \sqrt{rq_{11}} = \sqrt{r\left(\frac{1}{\sqrt{3}}\right)\sigma_{arw}} = 3^{-\frac{1}{4}}\sqrt{r\sigma_{arw}} = (0.76)\bar{\sigma}_{\Delta\theta},$$

wherein $\bar{\sigma}_{\Delta\theta}$ is the one sigma attitude error with one MEMS gyro array.

One sigma attitude errors in each axis using one IAE Approach will be reduced by a factor of $1/3^{1/4}$ (0.76) (in general will be by a factor of $1/N^{1/4}$ for N MEMS gyro arrays) as compared to $1/3^{1/2}$ (0.577) when one uses multiple IAEs Approach.

In FIG. 8, the present invention describes the Matlab models built to validate the IAE performance with two different approaches and assess their performance sensitivities to MEMS gyro angle random walks and misalignments among MEMS gyro arrays. As shown in FIG. 8, the table illustrates the IAE performance of different GS IAE configurations (TBU).

Two simulation cases are performed to evaluate the attitude estimation performance. The spacecraft attitude & body rates motion generated by the 6-DOF nonlinear, high-fidelity Micro-sat simulator. The Micro-Sat's dynamics is well considered in this simulation scenario. The spacecraft is orientated to sun pointing (SUP Mode) when it exits the eclipse zone and switched to geocentric attitude pointing (GAP mode) when it enters the eclipse zone.

The spacecraft's attitude measurements are provided by the star tracker model, and rate measurements are provided by two gyro models.

The simulation parameters are given below:

star tracker model: accuracy: 12 arcsecond, 1 sigma; 5 arcsecond @ across-boresight; 55 arcsecond @ boresight, 1 sigma.

gyro model: ARW: 0.7 deg/hr (TBC), bias: 5 deg/hr (TBC); and gyro misalignment angle (x, y, z): (0.5, 0.2, 0.4) degree.

As for case 1, the standard configuration in the prior performs a GS (Gyro-Stellar) IAE (Inertial Attitude Estimate) algorithm to process satellite attitude data from star sensor and body rates from two gyros to evaluate the attitude estimation IAE performance.

As for case 2, according to the present invention, the earth satellite attitude data fusion system and method can really get better attitude estimation IAE performance.

As shown in the FIG. 8, no matter the star sensor time delay is 0 or 0.25 sec, the earth satellite attitude data fusion system and method of the present invention not only can use data fusion algorithm to optimize the GS IAE results, but also can co-operate time-matching method to get the GS IAE results without effecting by the time-delay effect according to the star sensor data.

Figure 9:
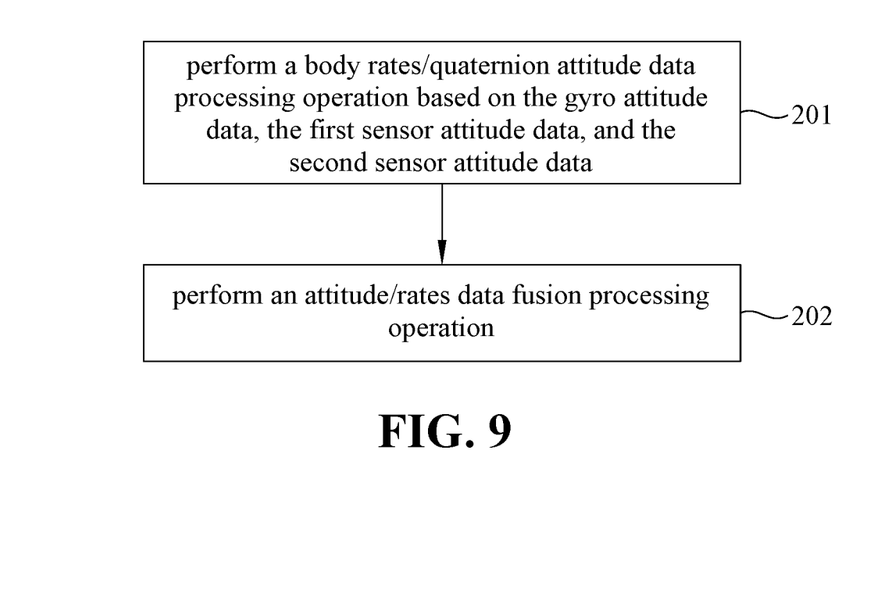
FIG. 9 is a flowchart to illustrate the earth satellite attitude data fusion method performed by an embodiment of the earth satellite attitude data fusion system in FIG. 5 according to the present invention.

FIG. 9 is a flowchart to illustrate the earth satellite attitude data fusion method performed by an embodiment of the earth satellite attitude data fusion system in FIG. 5 according to the present invention.

As shown in FIG. 9, step 201 is to perform a body rates/quaternion attitude data processing operation, wherein after receiving the body rates data $\tilde{\omega}^B(t)$ (the gyro attitude data) and the quaternion attitude data $\tilde{Q}_{ECI}^{ST1}(t-\tau)$ (the first sensor attitude data), the first EKF 2 performs an first algorithm based on the gyro attitude data $\tilde{\omega}^B(t)$ and the first sensor attitude data $\tilde{Q}_{ECI}^{ST1}(t-\tau)$ to obtain first IAE (Inertial Attitude Estimate) result data $\hat{Q}_{ECI}^{B1}(t) \cdot P_1$ (time t) and output it to an attitude data fusion algorithm module 7, wherein the previous quaternion attitude data $\tilde{Q}_{ECI}^{ST1}(t-\tau)$ (time (t-$\tau$)) are the quaternion attitude data converting from the ECI (Earth-Centered Inertial) frame coordinates to the sensor of the first star tracker 5, and is first sensor attitude data of the sensor of the first star tracker 5, wherein after receiving the body rates data $\tilde{\omega}^B(t)$ (the gyro attitude data) and the quaternion attitude data $\tilde{Q}_{ECI}^{ST2}(t-\tau)$ (the second sensor attitude data), the second EKF 3 performs an second algorithm based on the gyro attitude data and the second sensor attitude data to obtain second IAE (Inertial Attitude Estimate) result data $\hat{Q}_{ECI}^{B2}(t) \cdot P_2$ (time t) and output it to an attitude data fusion algorithm module 7, and wherein the previous quaternion attitude data $\tilde{Q}_{ECI}^{ST2}(t-\tau)$ (time (t-$\tau$)) is the quaternion attitude data converting from the ECI (Earth-Centered Inertial) frame coordinates to the sensor of the second star tracker 6, and is second sensor attitude data of the sensor of the second star tracker 6. Then, proceed to step 202.

Step 202 is to perform an attitude/rates data fusion processing operation, wherein the attitude data fusion algorithm module 7 receives the first IAE result data $\hat{Q}_{ECI}^{B1}(t) \cdot P_1$ and the second IAE result data $\hat{Q}_{ECI}^{B2}(t) \cdot P_2$, and performs the attitude/rates data fusion algorithm in a subsystem level to evaluate an attitude estimation IAE performance.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An earth satellite attitude data fusion system, applicable to an earth satellite space environment to estimate attitude data of a satellite, comprising:
  a first EKF (Extended Kalman Filter) of a GS IAE (Gyro-Stellar Inertial Attitude Estimate);
  a second EKF of the GS IAE;
  a sensor of a first star tracker;
  a sensor of a second star tracker;
  a 3-axis gyro; and
  an attitude data fusion algorithm module,
  wherein the 3-axis gyro and the sensor of the first star tracker are connected to the first EKF, respectively,
  wherein the 3-axis gyro and the sensor of the second star tracker are connected to the second EKF, respectively,
  wherein the first EKF and the second EKF are connected to the attitude data fusion algorithm module, respectively,
  wherein, the first EKF, the second EKF, the 3-axis gyro, the sensor of the first star tracker, and the sensor of the second star tracker are used to perform a body rates quaternion attitude data processing operation based on based on body rates data, first quaternion attitude data, and second quaternion attitude data to obtain first IAE (Inertial Attitude Estimate) result data and second IAE result data, and the attitude data fusion algorithm module performs an attitude/rates data fusion algorithm in a subsystem level to evaluate an attitude estimation IAE performance based on the first IAE result data, and the second IAE result data,
  wherein the body rates data is from the 3-axis gyro, the first quaternion attitude data is from the sensor of the first star tracker, and the second quaternion attitude data is from the sensor of the second tracker,
  wherein the first EKF of a GS IAE performs a first algorithm based on the body rates data and the first quaternion attitude data, proceeds a quaternion spacecraft attitude data correction process in a feedback working mode according to the body rates data, and first sensor attitude data from the sensor of the first star tracker, and outputs the first IAE result data to the attitude data fusion algorithm module, and
  wherein the second EKF of the GS IAE performs a second algorithm based on the body rates data and the second quaternion attitude data, proceeds a quaternion spacecraft attitude data correction process in a feedback working mode according to the body rates data, and second sensor attitude data from the sensor of the second star tracker, and outputs the second IAE result data to the attitude data fusion algorithm module.

2. The earth satellite attitude data fusion system as claimed in claim 1, wherein the first EKF comprises an extended Kalman filter module, a quaternion propagation/corrections module, and a time-matched quaternion module, and wherein the extended Kalman filter module, the quaternion propagation/corrections module, and the time-matched quaternion module collaboratively proceed the quaternion spacecraft attitude data correction process in the feedback working mode.

3. The earth satellite attitude data fusion system as claimed in claim 1, wherein the second EKF comprises an extended Kalman filter module, a quaternion propagation/corrections module, and a time-matched quaternion module, and wherein the extended Kalman filter module, the quaternion propagation/corrections module, and the time-matched quaternion module collaboratively proceed the quaternion spacecraft attitude data correction process in the feedback working mode.

\* \* \* \* \*